United States Patent
McTeer

(10) Patent No.: US 8,936,702 B2
(45) Date of Patent: Jan. 20, 2015

(54) SYSTEM AND METHOD FOR SPUTTERING A TENSILE SILICON NITRIDE FILM

(75) Inventor: Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 1295 days.

(21) Appl. No.: 11/370,269

(22) Filed: Mar. 7, 2006

(65) Prior Publication Data

US 2007/0212893 A1  Sep. 13, 2007

(51) Int. Cl.
C23C 14/00 (2006.01)
C23C 14/32 (2006.01)
C23C 14/06 (2006.01)
C23C 14/34 (2006.01)

(52) U.S. Cl.
CPC ......... *C23C 14/0042* (2013.01); *C23C 14/0094* (2013.01); *C23C 14/0057* (2013.01); *C23C 14/3485* (2013.01); *C23C 14/0652* (2013.01)
USPC ............. 204/192.23; 204/192.12; 204/192.13

(58) Field of Classification Search
CPC ............ C23C 14/0042; C23C 14/0094; C23C 14/0057; C23C 14/3485; C23C 14/0652
USPC .......... 204/192.13, 192.23; 438/520; 427/579
See application file for complete search history.

(56) References Cited

U.S. PATENT DOCUMENTS

| | | |
|---|---|---|
| 4,948,482 A | 8/1990 | Kobayashi |
| 5,047,131 A * | 9/1991 | Wolfe et al. ............... 204/192.23 |
| 5,700,718 A | 12/1997 | McTeer |
| 5,838,052 A | 11/1998 | McTeer |
| 5,939,788 A | 8/1999 | McTeer |
| 5,990,011 A | 11/1999 | McTeer |
| 6,016,010 A | 1/2000 | McTeer |
| 6,040,613 A | 3/2000 | McTeer |
| 6,069,075 A | 5/2000 | McTeer |
| 6,091,148 A | 7/2000 | McTeer |
| 6,110,830 A | 8/2000 | Skrovan |
| 6,140,701 A | 10/2000 | Raina |
| 6,194,308 B1 | 2/2001 | McTeer |
| 6,200,895 B1 | 3/2001 | Givens |
| 6,204,166 B1 | 3/2001 | McTeer |
| 6,204,179 B1 | 3/2001 | McTeer |
| 6,258,466 B1 | 7/2001 | McTeer |
| 6,261,947 B1 | 7/2001 | McTeer |
| 6,277,746 B1 | 8/2001 | Skrovan |
| 6,278,188 B1 | 8/2001 | McTeer |
| 6,339,026 B1 | 1/2002 | McTeer |
| 6,348,403 B1 | 2/2002 | McTeer |
| 6,348,721 B1 | 2/2002 | McTeer |
| 6,373,137 B1 | 4/2002 | McTeer |

(Continued)

OTHER PUBLICATIONS

Kobayashi et al.; journal entitled "Plasma-Enhanced Chemical Vapor Deposition of Silicon Nitride," Jpn. J. Appl. Phys. vol. 31 (1992) pp. 336-342; Part 1, No. 2A, Feb. 1992; XP000268164; pp. 336-342.

(Continued)

*Primary Examiner* — Michael Band
(74) *Attorney, Agent, or Firm* — Fletcher Yoder PC

(57) ABSTRACT

There is provided a system and method for sputtering a tensile silicon nitride film. More specifically, in one embodiment, there is provided a method comprising introducing nitrogen gas into a process chamber, wherein the process chamber includes a target comprising silicon, placing the process chamber into a transition region between a metallic region and a poisoned region, and applying a voltage to the target.

17 Claims, 3 Drawing Sheets

(56) References Cited

U.S. PATENT DOCUMENTS

| | | |
|---|---|---|
| 6,384,480 B1 | 5/2002 | McTeer |
| 6,455,424 B1 | 9/2002 | McTeer |
| 6,522,010 B2 | 2/2003 | McTeer |
| 6,537,428 B1 * | 3/2003 | Xiong et al. ............ 204/192.13 |
| 6,642,623 B2 | 11/2003 | McTeer |
| 6,649,519 B2 | 11/2003 | McTeer |
| 6,690,077 B1 | 2/2004 | McTeer |
| 6,709,958 B2 | 3/2004 | Li |
| 6,730,547 B2 | 5/2004 | Li |
| 6,800,504 B2 | 10/2004 | Li |
| 6,825,135 B2 | 11/2004 | Li |
| 6,825,501 B2 * | 11/2004 | Edmond et al. ................ 257/98 |
| 6,841,478 B2 | 1/2005 | McTeer |
| 6,858,465 B2 | 2/2005 | Li |
| 6,890,790 B2 | 5/2005 | Li |
| 6,916,397 B2 | 7/2005 | Pfeiffer |
| 7,241,653 B2 | 7/2007 | Hareland et al. |
| 7,319,066 B2 | 1/2008 | Saiki et al. |
| 2002/0045341 A1 | 4/2002 | McTeer |
| 2004/0082099 A1 | 4/2004 | Lin |
| 2005/0242406 A1 | 11/2005 | Hareland et al. |
| 2005/0275108 A1 | 12/2005 | Saiki et al. |
| 2006/0223290 A1 * | 10/2006 | Belyansky et al. ............ 438/520 |

OTHER PUBLICATIONS

European Patent Office Communication Pursuant to Article 94(3) EPC mailed Dec. 3, 2012.

Bao-Shun Yau, et al., Effects of Nitrogen Flow on R.F. Reactive Magnetron Sputtered Silicone Nitride Films on High Speed Steel; Surface and Coatings Technology, Elsevier Switzerland; vol. 176, No. 3, Jan. 15, 2004, pp. 290-295.

Braeuer G., et al., "Mid Frequency Sputtering—a Novel Tool for Large Area Coating"; Surface and Coatings Technology, Elsevier, Amsterdam, NL; vol. 94-95, No. 1-3, Oct. 1997, pp. 658-662.

Lang S. et al., Pulse Magnetron Sputtering in a Reactive Gas Mixture of Variable Composition to Manufacture Multilayer and Gradient Optical Coatings; vol. 502, No. 1-2, Jul. 2004, pp. 29-33.

Hoshi Y., et al., "Deposition of Silicone Nitride Films by High Rate Reactive Sputtering"; Japanese Journal of Applied Physics, vol. 19, No. Suppl 19-1, 1980, pp. 71-74.

Yao, et al., "Fabrication and Surface Characterization of Pulsed Reactive Closed-Field Unbalanced Magnetron Sputtered Amorphous Silicone Nitride Films"; Coatings Technology, Elsevier, Amsterdam, NL; vol. 200, No. 12-13, Mar. 2006, pp. 4144-4151.

* cited by examiner

SYSTEM AND METHOD FOR SPUTTERING A TENSILE SILICON NITRIDE FILM

BACKGROUND OF THE INVENTION

1. Field of the Invention

The present invention relates generally to the deposition of a silicon nitride film and, more particularly, to a system and method for sputtering a tensile silicon nitride film.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

As most people are generally aware, microprocessors are essentially generic devices that perform specific functions under the control of software programs, which may be stored in one or more memory devices that are coupled to the microprocessor and/or other peripherals. These microprocessors and memory devices generally include many different types of integrated circuits that are typically fabricated from one or more semiconductor materials. The integrated circuits work together to enable the microprocessor and/or memory device to carry out and control various functions within an electronic device. The integrated circuits are typically fabricated on a semiconductor wafer surface through any number of suitable manufacturing processes. One of these manufacturing processes is known as "layering." Layering generally refers to adding material to the surface of the wafer by a growth process, such as oxidation, or through a deposition process, such as chemical vapor deposition ("CVD") or physical vapor deposition ("PVD"), which is also referred to as "sputtering."

One of many suitable layers that may be added to the surface of the wafer is a silicon nitride ("SiN") film. There are a variety of suitable and beneficial uses for SiN films in the fabrication of integrated circuits. For example, SiN films may be employed to create a final passivation layer to cover a completed integrated circuit to protect the underlying integrated circuit and its components. In addition, SiN films may also be used as interdielectric layers in multimetallization schemes, as insulation between polysilicon and metallization layers, as doping barriers, as diffusion sources, as isolation regions, and/or as part of silicon gate structures.

For a variety of applications, it is beneficial to deposit the SiN film at or around room temperature to minimize the possibility of heat-related damage to any metal layers beneath the SiN film. Until recently, the only techniques for depositing room temperature SiN films were via fairly inefficient CVD processes. Recent advances, however, have facilitated the deposition of SiN films using PVD or sputtering. In sputtering, a working gas, such as argon, is introduced into a process chamber that contains the wafer to be layered and a slab of the desired film material (known as a "target"). Some form of electricity is then used to ionize the atoms of the working gas. The ionized gas atoms are then attracted to the target. When the ionized gas atoms strike the target, they "knock off" atoms from the target. These knocked off atoms then fall 5 towards the bottom of the process chamber where they are deposited on the surface of the wafer to create a film.

Disadvantageously, however, the sputtering of SiN films is generally still limited to sputtering SiN films with compressive stress. As those of ordinary skill in the art will appreciate, films under compressive stress have a negative film stress and, as such, tend to bend underlying layers of the integrated circuit in a convex shape. For a variety of applications, however, a tensile SiN film (a SiN film with a positive film stress that tends to bend underlying layers in a concave shape) would be advantageous. For example, negative channel metal oxide semiconductor ("NMOS") gate structures constructed with tensile SiN films perform better than similar ones constructed with compressive SiN films. As such, a system and method for sputtering a tensile SiN film would be desirable.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

There is provided a system and method for sputtering a tensile silicon nitride film. More specifically, in one embodiment, there is provided a method comprising introducing nitrogen gas into a process chamber, wherein the process chamber includes a target comprising silicon, placing the process chamber into a transition region between a metallic region and a poisoned region, and applying a voltage to the target.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

One or more of the embodiments described herein is directed towards a system and/or method for sputtering a tensile silicon nitride ("SiN") film. More specifically, in one embodiment, a threshold amount of nitrogen gas is introduced into a process chamber with a pressure of at least 6.5 millitorr ("mT"). Once the nitrogen gas has been introduced and the process chamber pressure is set, a voltage is applied to a silicon target to facilitate sputtering of a tensile SiN film.

Figure 1:
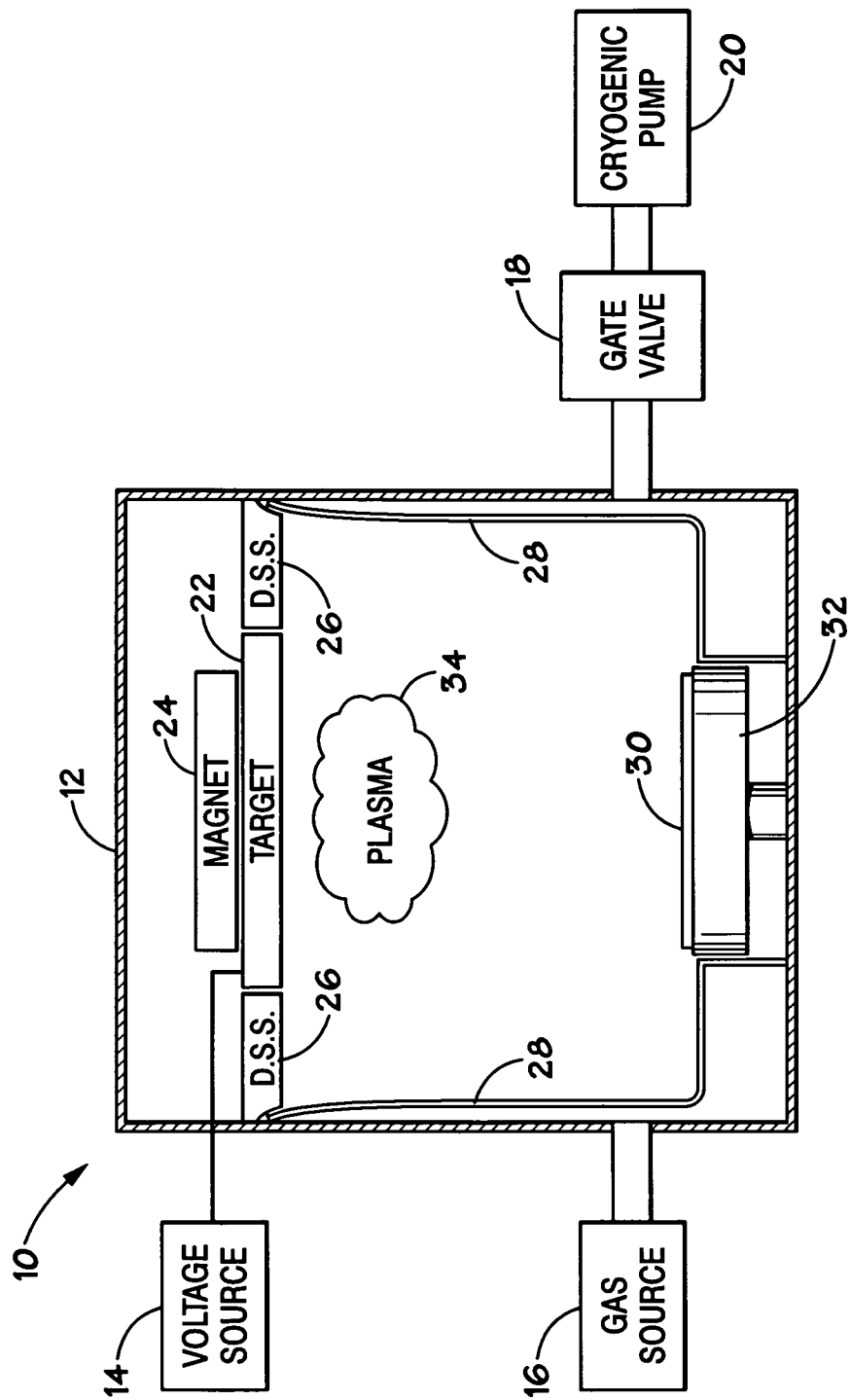
FIG. 1 is a diagram of an exemplary process chamber assembly configured to sputter a 5 tensile SiN film in accordance with embodiments of the present invention.

Turning initially to FIG. 1, a block diagram of an exemplary process chamber assembly configured to sputter a tensile SiN film in accordance with one embodiment is illustrated and generally designated by reference numeral 10. The assembly 10 may include a process chamber 12, a voltage source 14, a gas source 16, a variable gate valve 18 (also known as a "throttle" valve"), and a cryogenic pump 20. In one embodiment, the process assembly chamber 10 may be a component of an Endura™ system produced by Applied Materials Corporation of Santa Clara, Calif. In alternate embodiments, however, the process chamber assembly 10 may be part of another suitable semiconductor processing system or may be a stand alone assembly. Moreover, it will be appreciated that the illustrated components of the process chamber assembly 10 are not intended to be exclusive. As such, in alternate embodiments, other suitable components may be included in the process chamber assembly 10 and/or one or more of the illustrated components may be omitted or replaced.

The process chamber 12 also includes a target 22. In one embodiment, the target 22 includes a planar-shaped slab of silicon or polysilicon, which may be impregnated with a low level of another substance, such as boron, to make the target conductive enough to sputter. In alternate embodiments, however, the target 22 may be other shapes and/or composed of other suitable materials. In one embodiment, the silicon or polysilicon slab is mounted on a metallic backing plate (not shown), which may be coupled to the voltage source 14, as illustrated. As will be discussed in more detail below, in one embodiment, the voltage source 14 may be configured to apply a DC voltage to the metallic backing plate to facilitate the sputtering of silicon atoms from the target 22. In alternate embodiments, the voltage source 14 may include a pulsed DC supply.

The process chamber 12 also may include a magnet 24 arrayed around and/or behind the target 22. As those of ordinary skill in the art will appreciate, the magnet 24 may be configured to capture and/or confine electrons at the front of the target to increase the efficiency of the sputtering within the process chamber 12. The magnet 24 allows for sputtering at lower pressures, which may be advantageous for creating a tensile SiN film. It will also be appreciated that although the magnet 24 is described in the singular, in alternate embodiments, any suitable number of individual magnets may comprise the magnet 24. Moreover, in still other alternate embodiments, the magnet 24 may be omitted from the process chamber 12.

A dark space shield ("DSS") 26 may be arrayed on either side of the target 22. This dark space shield 26, in combination with a shield 28, may be configured to protect the interior of the process chamber 12 from the silicon atoms being sputtered off of the target 22. More specifically, as those with ordinary skill in the art will appreciate, the dark space shield and the shield 28 are typically consumable components that receive those atoms from the target 22 that are sputtered off the target 22 with trajectories that do not impact a wafer 30 at the bottom of the process chamber. In other words, when the silicon atoms are knocked off the target 22, only a subset of the knocked off atoms will be knocked off such that their trajectories impact the wafer 30. Those atoms that do not land on the wafer 30 will end up on either the dark space shield 26 or the shield 28. Eventually when enough silicon builds up on the dark space shield 26 and the shield 28, these components can be replaced. In this way, the dark space shield 26 and the shield 28 protect the inside of the process chamber 12.

As illustrated in FIG. 1, the wafer 30, which may include a silicon wafer or other suitable semiconductor substrate, may sit upon a pedestal 32. In various embodiments, the wafer 30 be unattached to the pedestal 32, may be clamped to the pedestal 32, or may be electrostatically chucked to the pedestal 32.

Looking next at the operation of the process chamber assembly 10, the gas source 16 may be configured to supply a working gas, such as argon, into the process chamber 12. In addition, the gas source 16 may also introduce nitrogen into the process chamber 12. As will be described further below, the introduced nitrogen gas enables the creation of the SiN film. In one embodiment, the flow of both the working gas and the nitrogen gas may be controlled by mass flow controllers ("MFCs"). Moreover, in one embodiment, the amount of working gas and nitrogen gas introduced into the process chamber 12 may be measured in standard cubic centimeters per minute ("sccm").

Once the working gas and nitrogen gas have been introduced into the process chamber 12, the gate value 18 may be configured to set the process chamber at a process pressure. For example, the gate value 18 may be configured to set the process chamber pressure at or above a pressure threshold associated with a transition region, as described further below. In one embodiment, the pressure threshold is greater than or equal to 6.5 millitorr ("mT"). It will be appreciated, however, that the threshold pressure level may vary depending on the flow rate of the nitrogen and/or argon gas, the chamber volume, the pumping speed, the deposition rate, and so forth. In one embodiment, the position of the gate valve 18 may be adjusted to facilitate a process pressure at or above the chamber pressure threshold. It will be appreciated, however, that in alternate embodiments, other suitable types of pumping equipment may be employed to set the pressure of the process chamber 12.

When the gas source 16 is providing argon and nitrogen into the process chamber 12 and the cryogenic pump 20 is maintaining a chamber pressure above 6.5 mT, the voltage source 14 may be configured to apply a cathode voltage to the target 22. In one embodiment, the voltage source 14 may include a pulsed DC supply. As will be described further below, a pulsed DC supply advantageously creates a transition region within the process chamber 12 under one set of process conditions. In addition, a pulsed DC supply is also advantageous for sputtering off the target 12, which may develop a dielectric SiN surface when operating in the transition region (described in greater detail below). In alternate embodiments, other types of voltage sources, such as a RF supply, may be employed if they are configured to provide a transition region, as described below.

As described above, applying a voltage to the target 22 may charge the argon atoms within the working gas to create plasma 34 that will sputter atoms from the target 22 down onto the wafer 30. As silicon atoms are sputtered off of the target 22, they may combine with the nitrogen gas in the process chamber 12 to form silicon nitride ("SiN") that creates a SiN film the wafer 30.

As noted above, the gas source 16 may be configured to introduce nitrogen gas into the process chamber 12 during sputtering to create the SiN film. However, the introduced nitrogen, as a reactive gas, may affect the target 22. More specifically, the introduced nitrogen will ionize also and it will react with the silicon target 22. If the reaction rate to the target 22 is fast enough—faster than the sputtering off of the target 22, there will be an accumulation of a nitride surface on the target 22. This condition is known as a "poisoned" mode. In the poisoned mode, deposition onto the wafer 30 is greatly reduced or halted altogether. If, however, the sputtering is at a high enough rate or if there is not that much nitrogen in the chamber, a nitride cannot accumulate on the surface of the target 22. This condition is known as a "metallic" or a non-poisoned mode. The term metallic mode is a holdover from the sputtering of metals, which were amongst the first materials to be sputtered. As such, it will be appreciated that the metallic mode described herein does not involve the deposition of metals.

Figure 2:
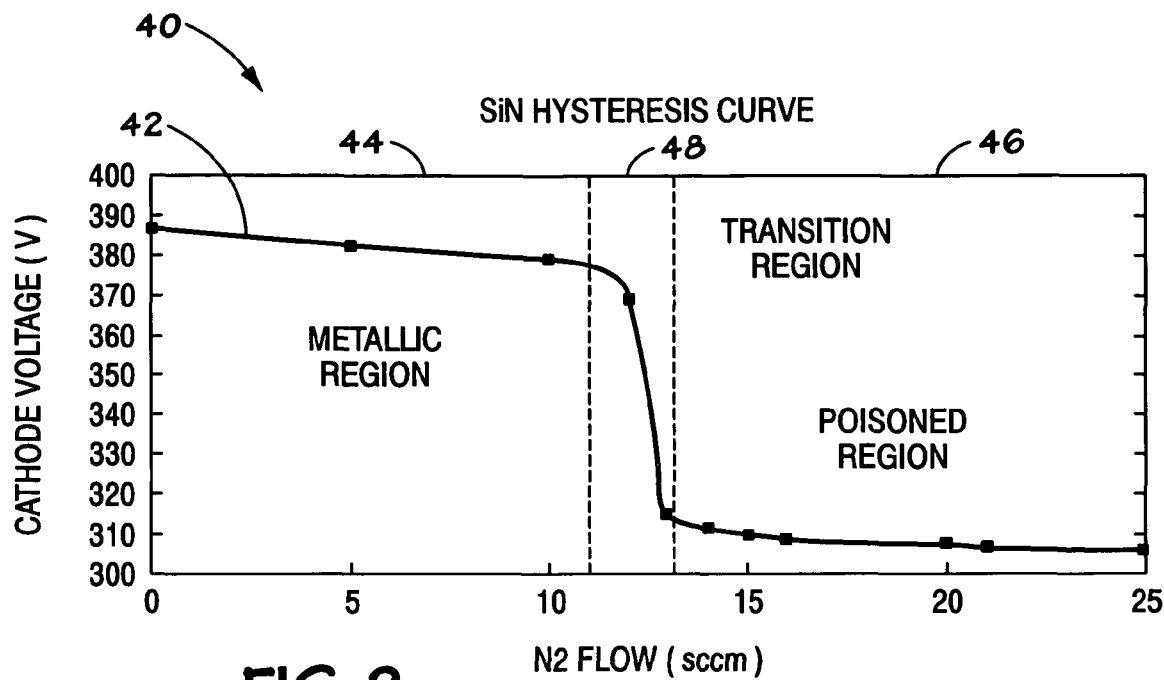
FIG. 2 is a graph illustrating an exemplary SiN hysteresis curve in accordance with embodiments of the present invention.

One technique to detect the poisoned mode is to monitor the cathode voltage of the target 22, because the cathode voltage of the target 22 is affected by the nitride being formed on the target 22. More specifically, it will be appreciated that the cathode voltage of the target 22 is a function of power applied from the voltage source 14 divided by the current flowing through the target 22. However, in the poisoned mode, the amount of nitrogen in the process chamber leads to an increase in secondary electron generation, which increases the target current and decreases the cathode voltage. For example, FIG. 2 is a graph 40 illustrating an exemplary SiN hysteresis curve 42 in accordance with one embodiment. As illustrated in FIG. 2, at or below a nitrogen gas flow of approximately 10.4 sccm, the cathode voltage on the target 22 is relatively constant between 380 volts and 390 volts. At this cathode voltage level, the process chamber 12 is operating in the metallic mode (referred to as a metallic region 44). In this metallic region 44, the target 22 is not poisoned and silicon atoms may be sputtered from the target 22 within the process chamber 12.

If the nitrogen flow reaches a certain level (e.g. approximately 14 sccm), the target 22 may become poisoned and the process chamber 12 will enter a poisoned region 46. In the poisoned region 46, the cathode voltage of the target 22 may drop substantially (e.g., in FIG. 2, down to 310 volts) and sputtering of silicon atoms of the target 22 may be greatly reduced or halted, because the nitride is accumulating on the surface of the target faster than it can be sputtered off.

However, as is also illustrated in FIG. 2, there exists a transition region 48 between the metallic region 44 and the poisoned region 46. When the process chamber 12 is in the transition region 48, the cathode voltage of the target 22 fluctuates fairly rapidly with the amount of nitrogen gas. Further, as will be described further below, when the pressure within the process chamber 12 is above a threshold of 6.5 mT (for a set of chamber conditions, as described above), a SiN film sputtered during the transition region will be a tensile SiN film; whereas sputtering in the metallic or poisoned regions will produce a compressive SiN film.

As described above, for a variety of applications, sputtering a tensile SiN film (a SiN film with a positive film stress that tends to bend underlying layers in a concave shape) is advantageous. For example, negative channel metal oxide semiconductor ("NMOS") gate structures constructed with tensile SiN films perform better than similar ones constructed with compressive SiN films. It will be appreciated, however, that this is merely one example of an advantage of sputtering a tensile SiN film, and, as such, not intended to be exclusive.

Figure 3:
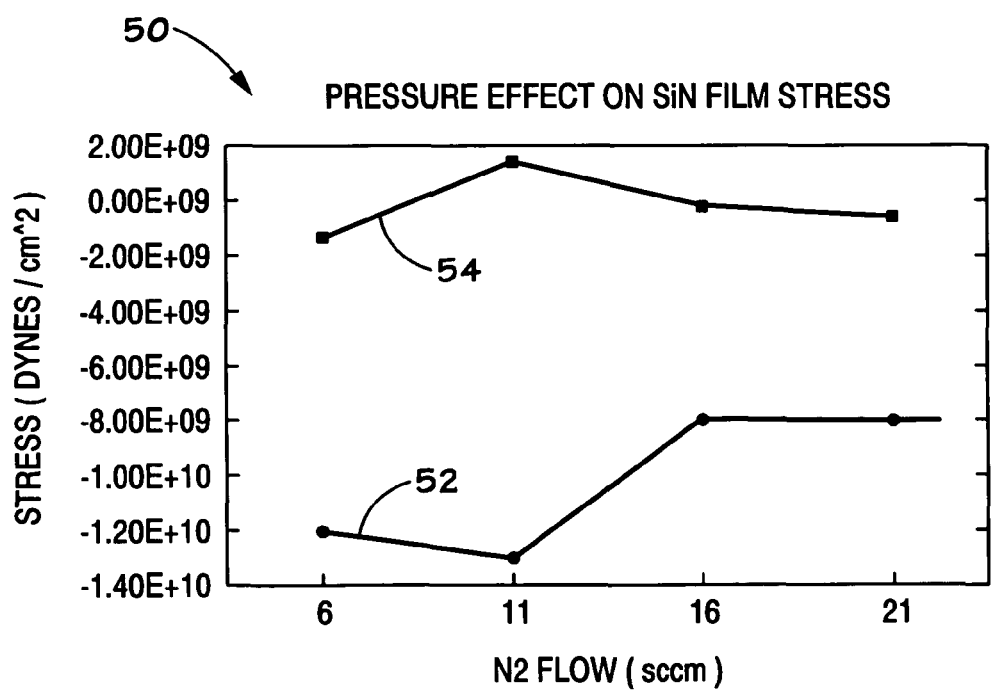
FIG. 3 is a graph illustrating a relationship between nitrogen flow and SiN film stress for two exemplary process chamber pressures in accordance with embodiments of the present invention.

FIG. 3 is a graph 50 illustrating a relationship between nitrogen flow and SiN film stress for two exemplary process pressures in accordance with one embodiment. As illustrated by curve 52 which represents SiN film stress versus nitrogen flow for a chamber pressure of 5.3 mT, the SiN film stress remains compressive (i.e., negative) for nitrogen gas flows from 6 sccm through 21 sccm (i.e., in the metallic, transition, and poisoned regions). However, as illustrated by curve 54, when the chamber pressure is at 10.4 mT, the film stress becomes tensile (i.e., positive) when the process chamber 12 is operating in the transition region.

Figure 4:
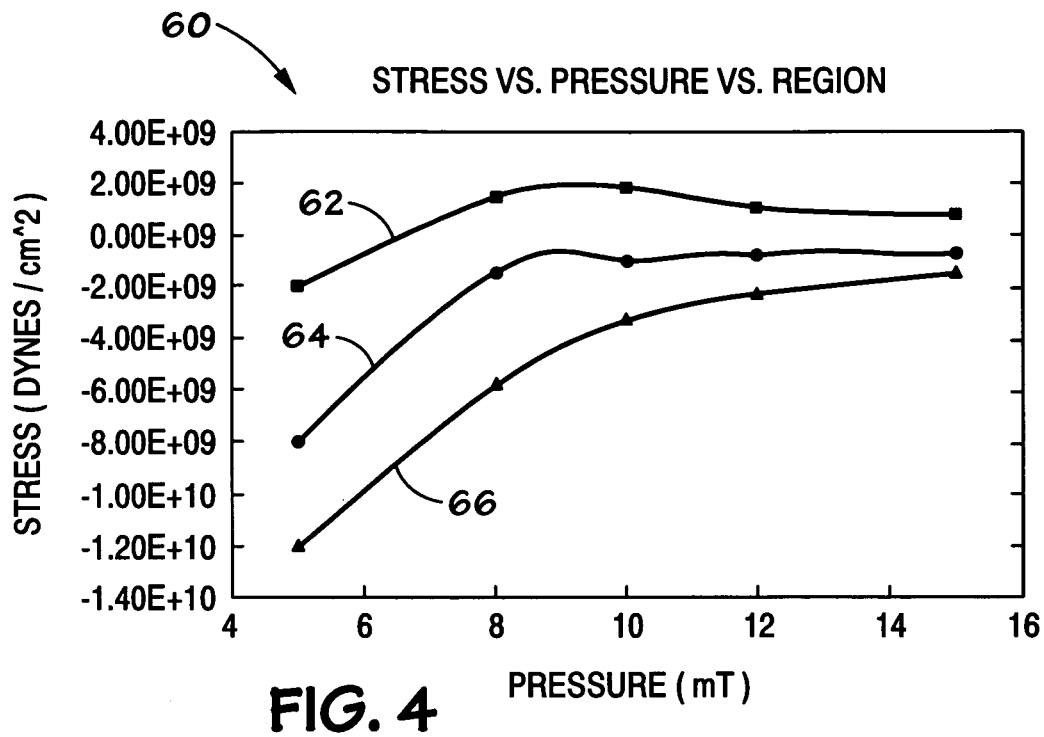
FIG. 4 is a graph illustrating relationships between process chamber pressure and SiN film stress for operation of the process chamber in a metallic region, a transition region, and a poisoned region in accordance with embodiments of the present invention.

This relationship between a tensile film stress and the pressure of the process chamber 12 is further illustrated in FIG. 4, which depicts a graph 60 illustrating relationships between process chamber pressure and SiN film stress for operation of the process chamber in the transition region (curve 62), in the poisoned region 46 (curve 64), and in the metallic region 48 (curve 66). As shown in FIG. 4, it is only during the transition region that the film stress of the SiN film becomes tensile (i.e., positive). Furthermore, as shown in FIG. 4, a tensile SiN film will also only be created when the process pressure in the process chamber 12 is above approximately 6.5 mT.

Figure 5:
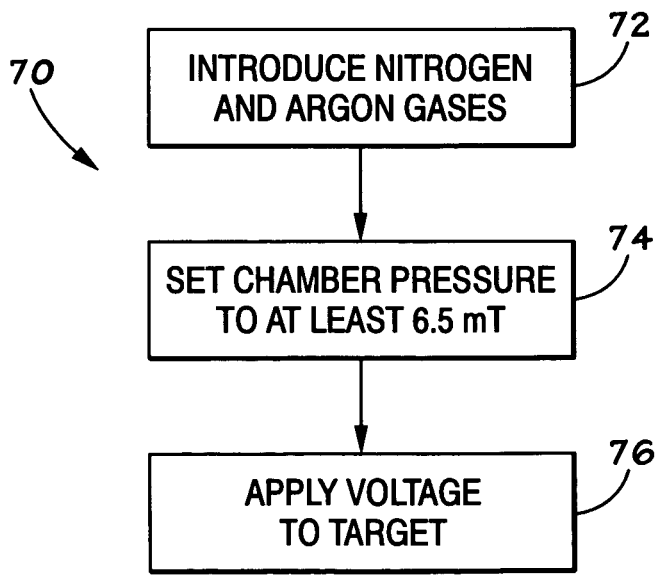
FIG. 5 is a flow chart illustrating an exemplary technique for sputtering a tensile SiN film.

Turning next to FIG. 5, a flow chart illustrating an exemplary technique for sputtering a tensile SiN film in accordance with one embodiment is illustrated and generally designated by reference numeral 70. In one embodiment, the technique 70 may be performed by the process chamber assembly 10 illustrated in FIG. 1. In alternate embodiments, however, other suitable assemblies and/or process devices may be employed to perform the technique 70.

As indicated by block 72 of FIG. 5, the technique 70 may begin with the gas source 16 introducing nitrogen and argon gases into the process chamber 12. As stated above, the nitrogen gas is introduced at a level sufficient to place the process chamber 12 into the transition region 48. For example, in one embodiment, the gas source may introduce nitrogen gas at a flow rate of between 8 sccm and 14 sccm. It will be appreciated, however, that the amount of nitrogen gas introduced into the process chamber 12 may depend upon a variety of chamber and process conditions. As such, in alternate embodiments, other amounts of nitrogen gas may be suitable to place the process chamber 12 into the transition region 48.

Next, as indicated by block 74, the process pressure within the process chamber 12 will be set to at least approximately 6.5 mT. In one embodiment, the operation of the cryogenic pump 20 and the position of the gate valve 18 may be adjusted to set the pressure of the process chamber 12 to at least 6.5 mT. Lastly, the voltage source 14 may apply a voltage to the target 22, as indicated by block 76. As described above, in one embodiment, the voltage source 14 may include a time varying pulsed DC supply configured to apply a DC voltage to the target 22. Advantageously, unlike an RF supply, a pulsed DC supply does not require matching and may be less expensive to purchase and/or operate. Lastly, applying the voltage to the target 22 will cause the plasma 34 to be formed facilitating the sputtering of the SiN film onto the wafer 30.

While the invention may be susceptible to various modifications and alternative forms, specific embodiments have been shown by way of example, in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method comprising:
   introducing nitrogen gas into a process chamber at greater than 10.4 standard cubic centimeters per minute (sccm)

and less than approximately 14 sccm, wherein the process chamber includes a target comprising silicon;

placing the process chamber into a transition region between a metallic region and a poisoned region;

applying a DC voltage greater than approximately 310 volts and less than approximately 380 volts to the target;

sputtering a tensile silicon nitride film while the process chamber is in the transition region; and monitoring a cathode voltage of the target to detect a poisoned mode comprising an accumulation of a nitride surface on the target.

2. The method, as set forth in claim 1, wherein placing the process chamber into a transition region comprises setting a pressure of the process chamber equal to or greater than approximately 6.5 mT.

3. The method, as set forth in claim 1, wherein applying the DC voltage to the target comprises apply a pulsed DC voltage to the target.

4. The method, as set forth in claim 1, wherein applying the voltage to the target comprises applying the voltage to a metal backing plate mounted to the silicon.

5. The method, as set forth in claim 1, comprising introducing a working gas into the process chamber.

6. The method, as set forth in claim 1, wherein the tensile silicon nitride film comprises a concave shape.

7. A method comprising:

introducing a reactive gas into a process chamber comprising a target comprising silicon, wherein the reactive gas is introduced at a flow rate between greater than 10.4 standard cubic centimeters per minute (sccm) and less than approximately 14 sccm;

setting a pressure in the process chamber to greater than or equal to 6.5 mT;

applying a DC voltage greater than approximately 310 volts and less than approximately 380 volts to the target to form a tensile silicon nitride film from silicon nitride sputtered while the reactive gas is introduced at the flow rate greater than 10.4 standard cubic centimeters per minute (sccm) and less than approximately 14 sccm and while the pressure in the process chamber is approximately 6.5 mT or above; and monitoring a cathode voltage of the target to detect a poisoned mode comprising an accumulation of a nitride surface on the target.

8. The method, as set forth in claim 7, wherein applying the DC voltage to the target comprises apply a pulsed DC voltage to the target.

9. The method, as set forth in claim 7, wherein applying the voltage to the target comprises applying the voltage to a metal backing plate mounted to the silicon.

10. The method, as set forth in claim 7, comprising introducing a working gas into the process chamber.

11. The method, as set forth in claim 7, wherein the tensile silicon nitride film comprises a concave shape.

12. A method comprising:

introducing a nitrogen gas at greater than 10.4 standard cubic centimeters per minute (sccm) and less than approximately 14 sccm into a process chamber comprising a target comprising silicon;

placing the process chamber into a transition region between a metallic region and a poisoned region;

applying a DC voltage greater than approximately 310 volts and less than approximately 380 volts to the target to sputter silicon nitride while the process chamber is in the transition region, wherein the method forms a tensile silicon nitride film comprising the sputtered silicon nitride; and monitoring a cathode voltage of the target to detect a poisoned mode comprising an accumulation of a nitride surface on the target.

13. The method, as set forth in claim 12, wherein placing the process chamber into a transition region comprises setting a pressure of the process chamber equal to or greater than approximately 6.5 mT.

14. The method, as set forth in claim 12, wherein applying the DC voltage to the target comprises apply a pulsed DC voltage to the target.

15. The method, as set forth in claim 12, wherein applying the voltage to the target comprises applying the voltage to a metal backing plate coupled mounted to the silicon.

16. The method, as set forth in claim 12, comprising introducing a working gas into the process chamber.

17. The method, as set forth in claim 12, wherein the tensile silicon nitride film comprises a concave shape.

* * * * *

UNITED STATES PATENT AND TRADEMARK OFFICE
CERTIFICATE OF CORRECTION

PATENT NO. : 8,936,702 B2  
APPLICATION NO. : 11/370269  
DATED : January 20, 2015  
INVENTOR(S) : Allen McTeer Page 1 of 1

It is certified that error appears in the above-identified patent and that said Letters Patent is hereby corrected as shown below:

In the Claims

In column 7, line 29, in Claim 7, after "rate" delete "between".

In column 7, line 38, in Claim 7, delete "10.4standard" and insert -- 10.4 standard --, therefor.

In column 8, line 38, in Claim 15, after "plate" delete "coupled".

Signed and Sealed this
Eighteenth Day of August, 2015

Michelle K. Lee
*Director of the United States Patent and Trademark Office*